United States Patent
Poelzl et al.

(10) Patent No.: US 8,633,539 B2
(45) Date of Patent: Jan. 21, 2014

(54) TRENCH TRANSISTOR AND MANUFACTURING METHOD OF THE TRENCH TRANSISTOR

(75) Inventors: Martin Poelzl, Ossiach (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 162 days.

(21) Appl. No.: 13/170,091

(22) Filed: Jun. 27, 2011

(65) Prior Publication Data

US 2012/0326229 A1 Dec. 27, 2012

(51) Int. Cl.
  *H01L 29/76* (2006.01)
(52) U.S. Cl.
  USPC ..... 257/330; 257/331; 257/332; 257/E29.262
(58) Field of Classification Search
  USPC ................... 257/330–332, 341, 342, E29.262
  See application file for complete search history.

(56) References Cited

U.S. PATENT DOCUMENTS

| | | |
|---|---|---|
| 5,283,201 A | 2/1994 | Tsang et al. |
| 5,973,360 A | 10/1999 | Tihanyi |
| 7,091,573 B2 * | 8/2006 | Hirler et al. ................... 257/500 |
| 7,375,029 B2 * | 5/2008 | Poelzl ........................... 438/637 |
| 7,816,210 B2 | 10/2010 | Poelzl et al. |
| 7,872,305 B2 * | 1/2011 | Hunt ............................. 257/330 |
| 8,263,460 B2 * | 9/2012 | Kim .............................. 438/270 |
| 2007/0059887 A1 * | 3/2007 | Poelzl et al. ................. 438/270 |

FOREIGN PATENT DOCUMENTS

DE  10 2005 041 108 B3  5/2007

* cited by examiner

*Primary Examiner* — Tuan N. Quach
(74) *Attorney, Agent, or Firm* — Murphy, Bilak & Homiller, PLLC

(57) ABSTRACT

A semiconductor device includes a semiconductor body including a first surface and a second surface. The semiconductor device further includes a trench structure extending into the semiconductor body from the first surface. The trench structure includes a first gate electrode part and a first gate dielectric part in a first part of the trench structure, and a second gate electrode part and a second gate dielectric part in a second part of the trench structure. A width of the trench structure in the first part is equal to the width of the trench structure in the second part. The semiconductor device further includes a body region adjoining the first and second gate dielectric parts at a side wall of the trench structure. A distance $d_1$ between a bottom edge of the first gate dielectric part and the first surface and a distance $d_2$ between a bottom edge of the second gate dielectric part and the first surface satisfies 50 nm$<d_1-d_2$.

21 Claims, 15 Drawing Sheets

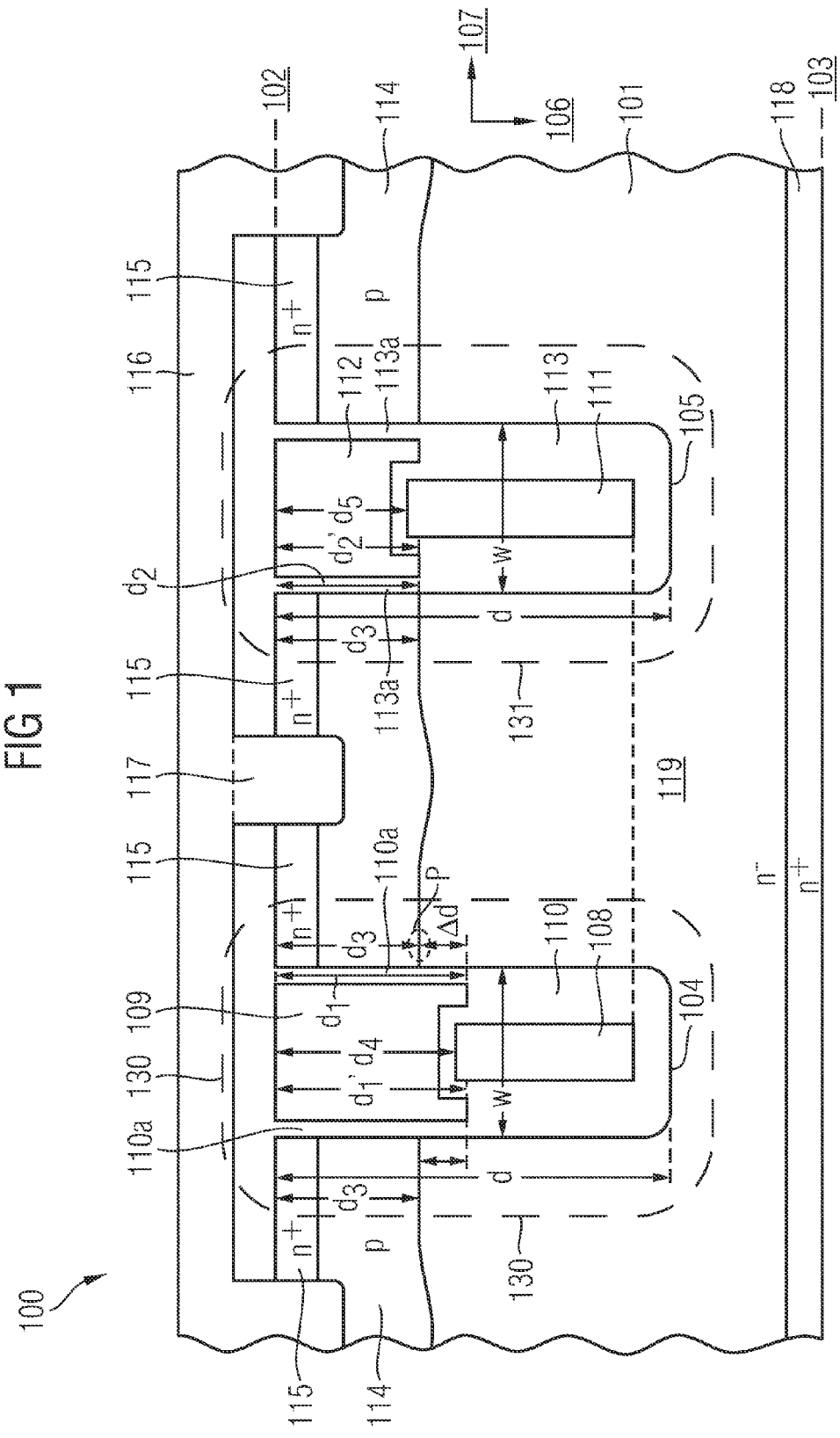

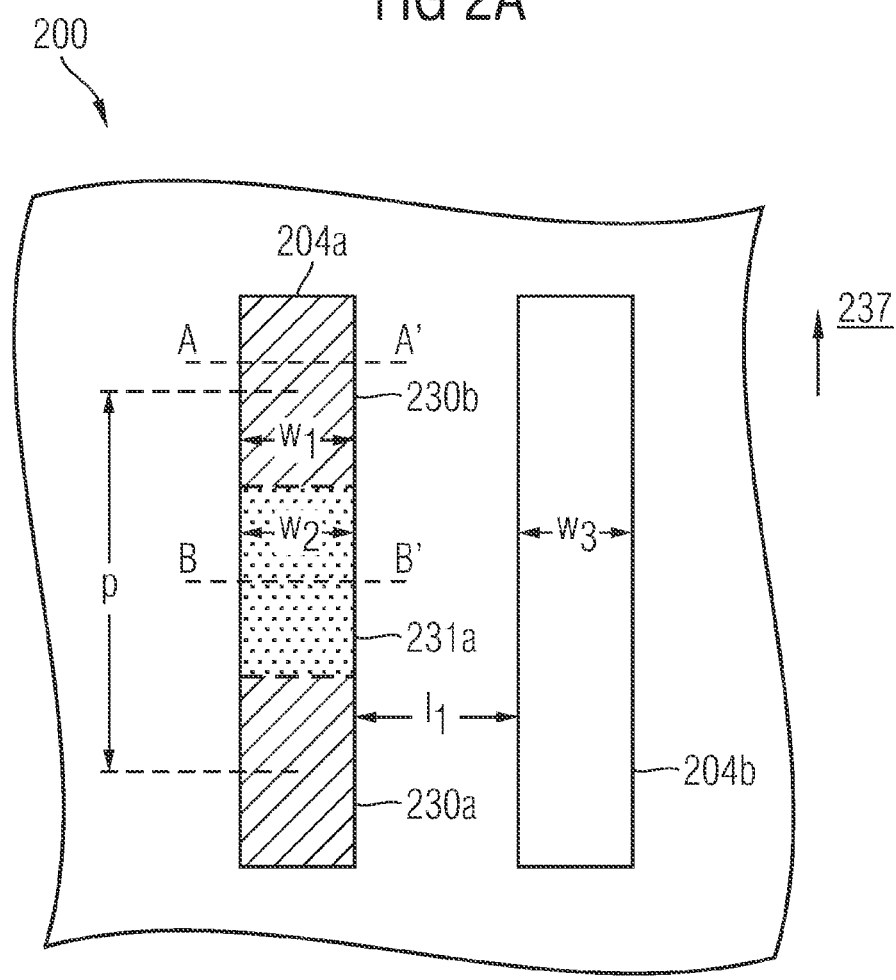

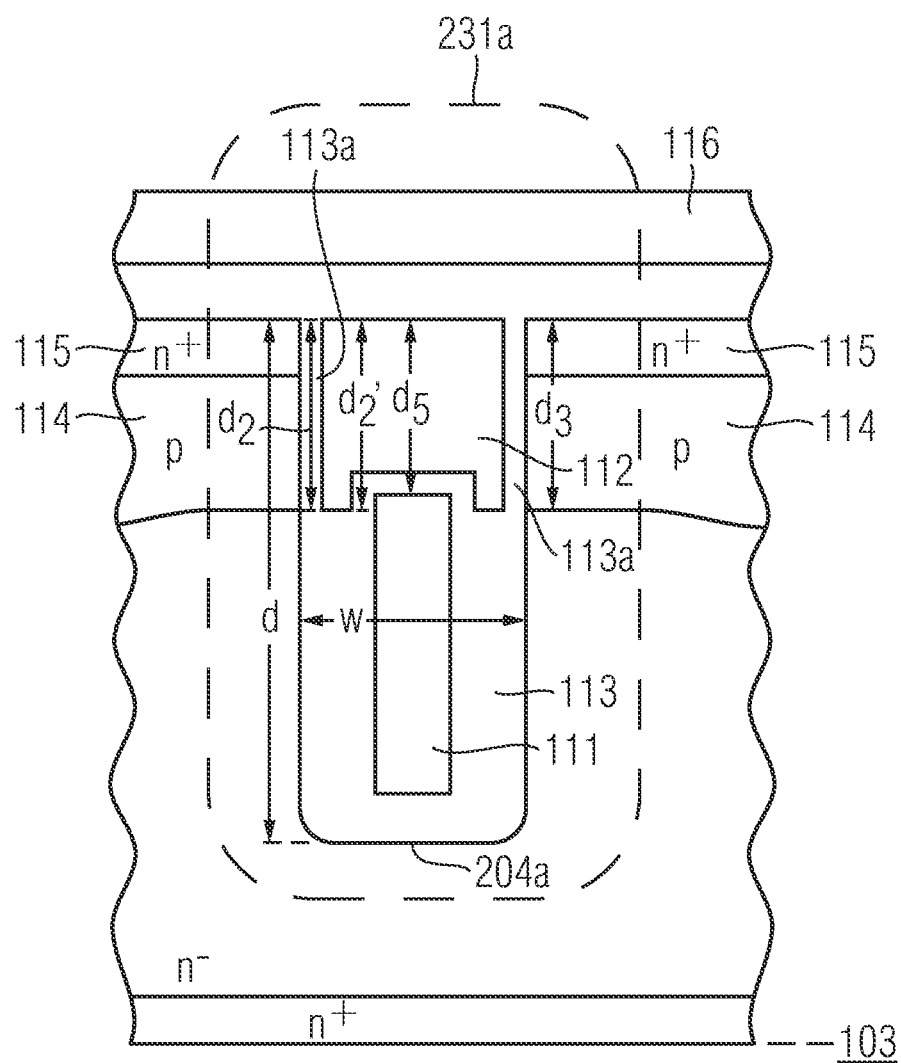

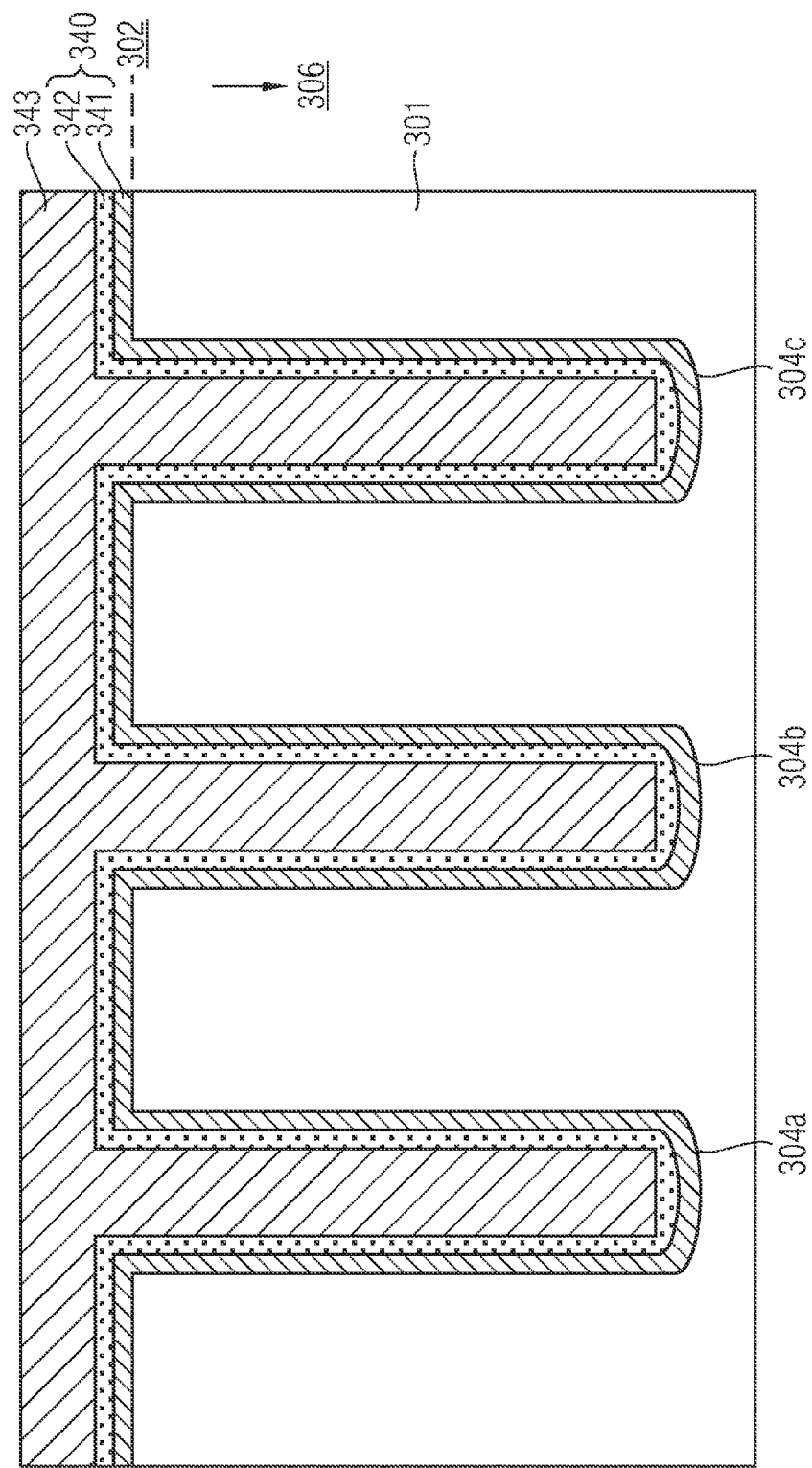

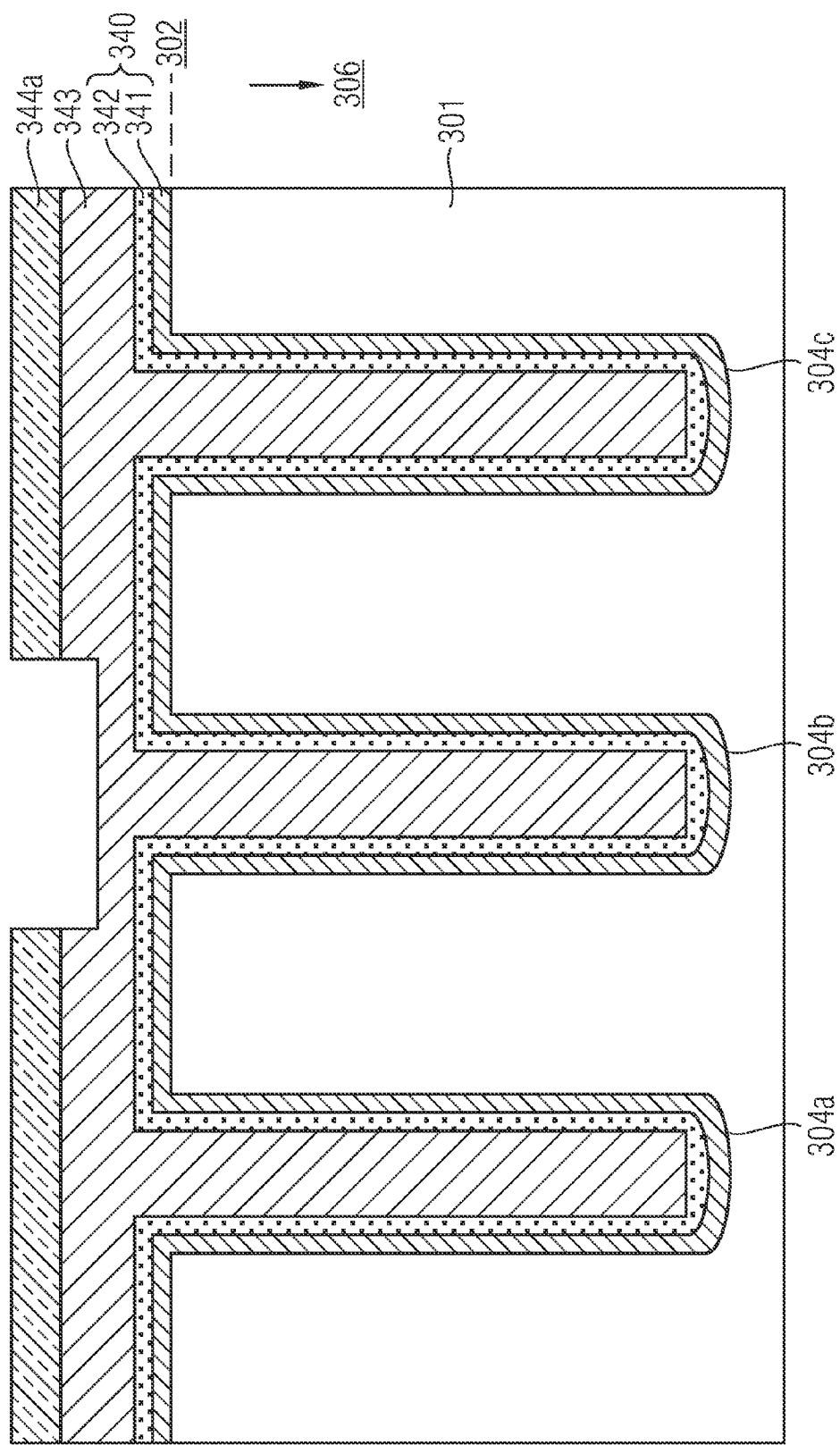

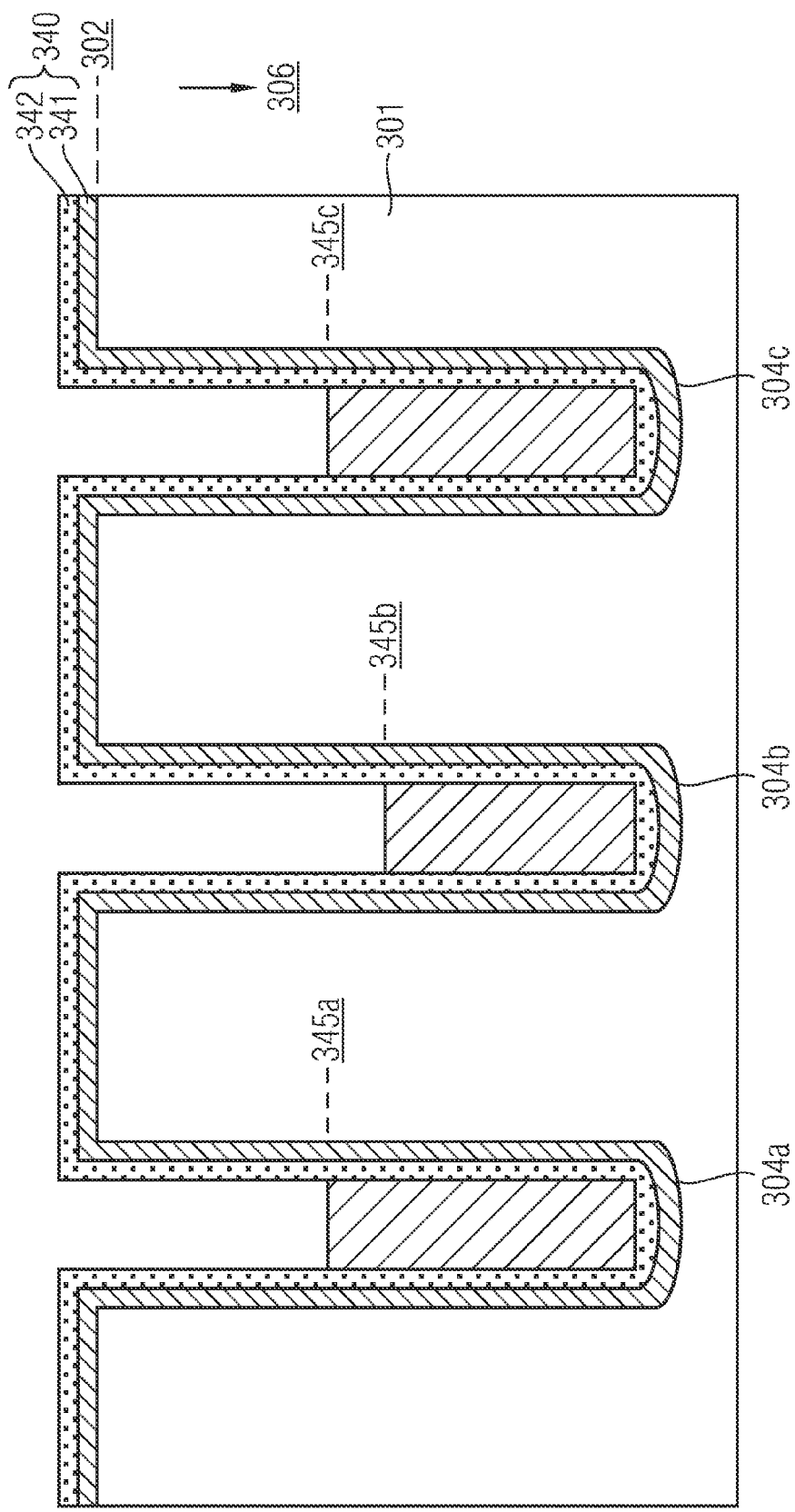

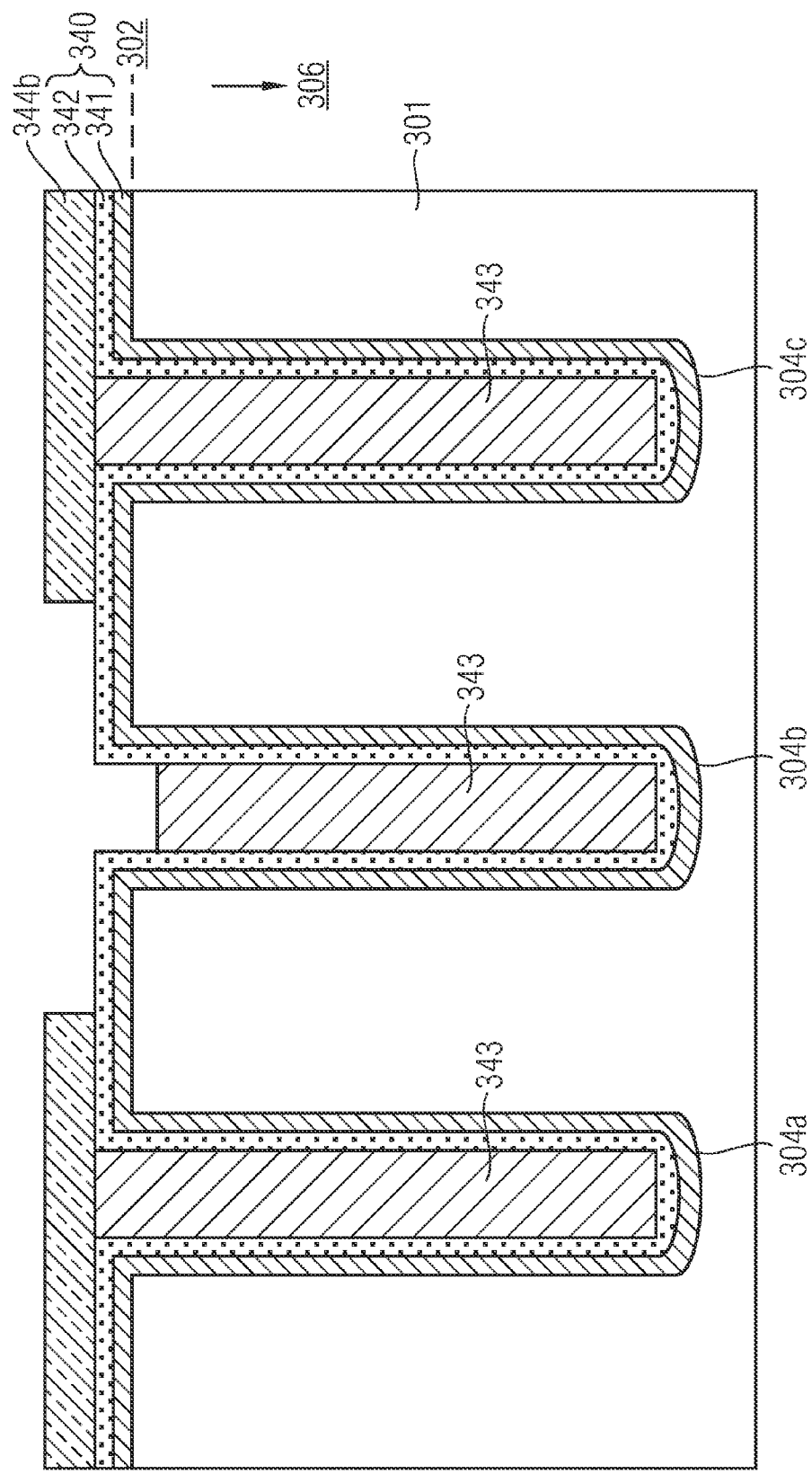

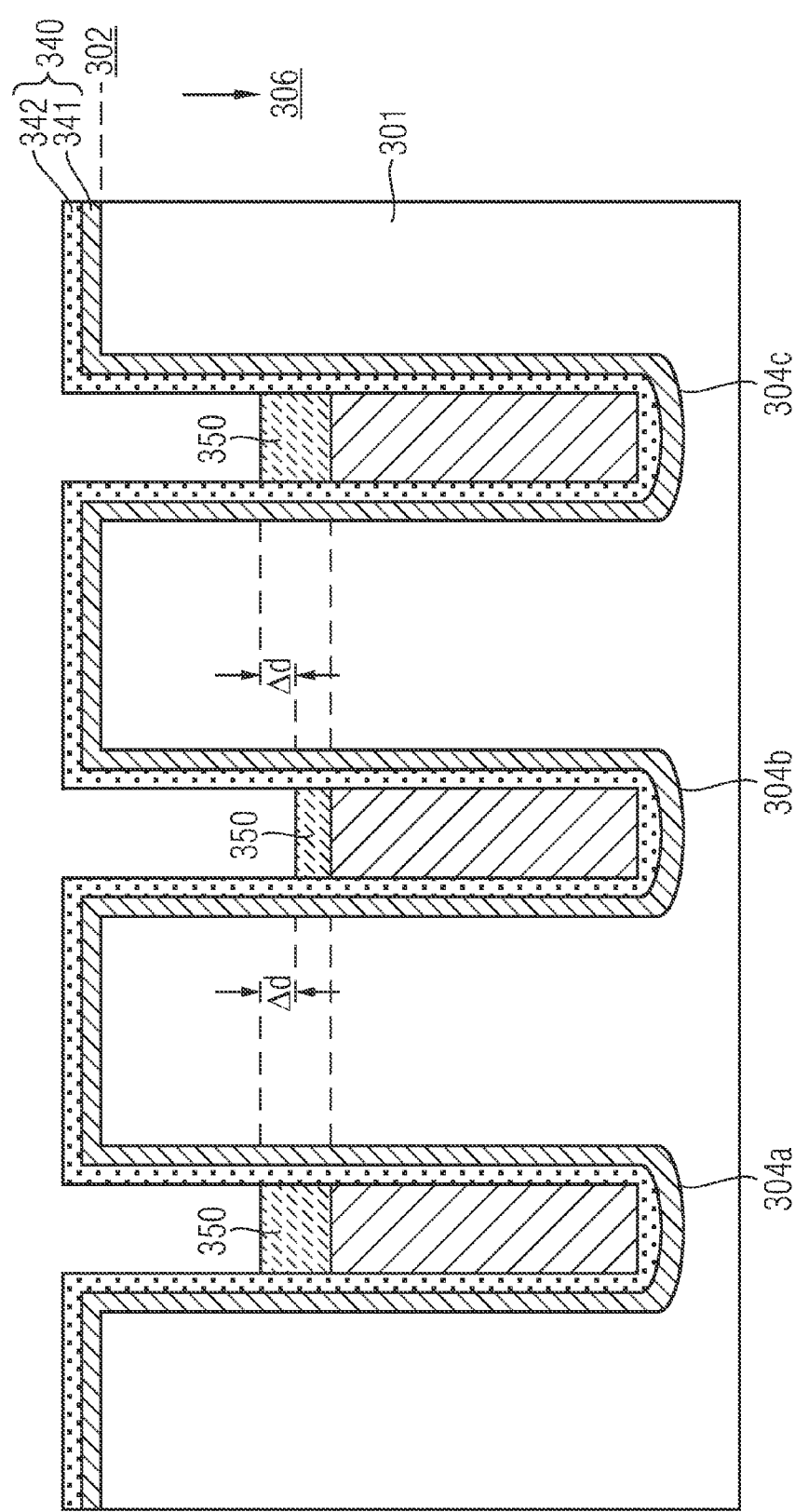

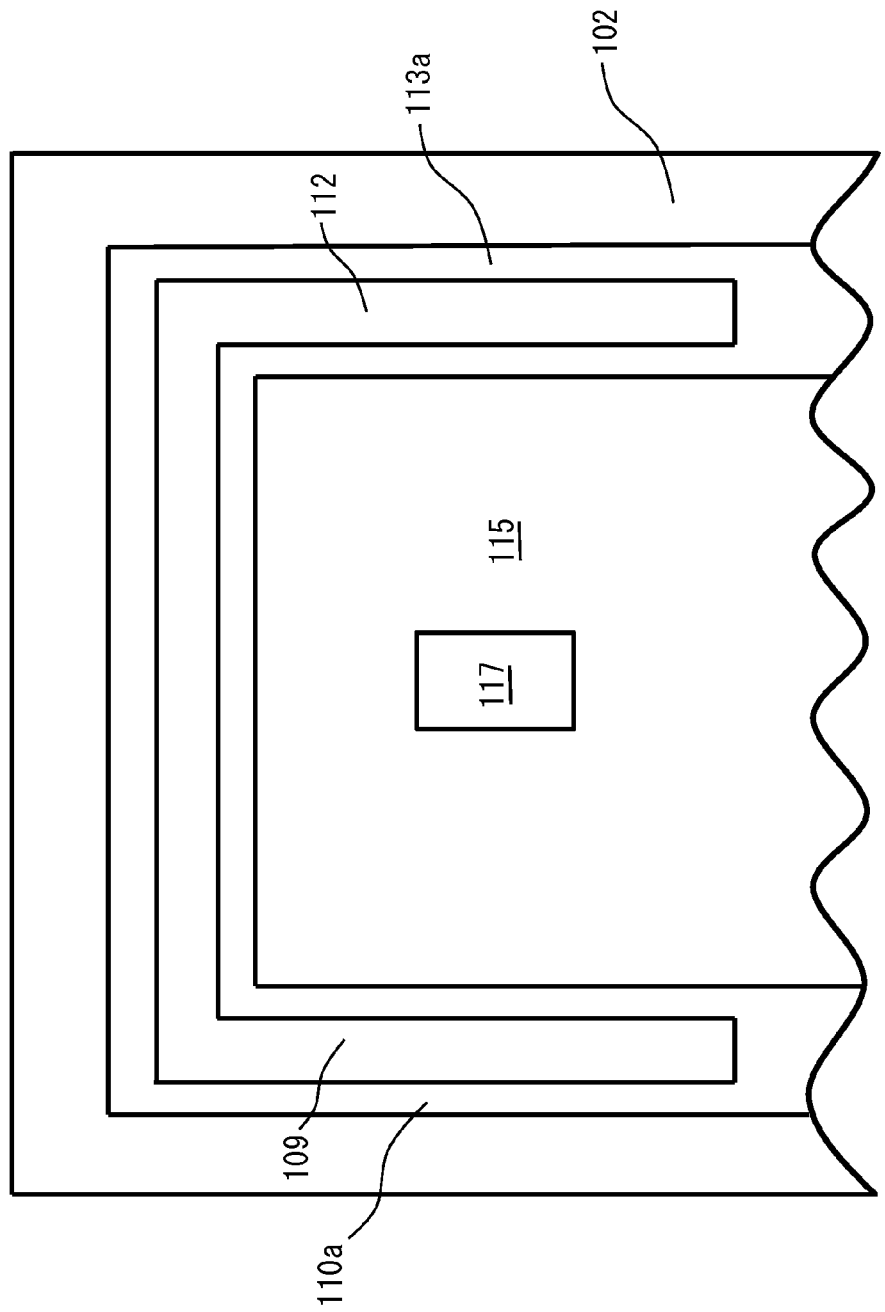

TRENCH TRANSISTOR AND MANUFACTURING METHOD OF THE TRENCH TRANSISTOR

BACKGROUND

Field-effect controlled power switching structures such as trench Metal Oxide Semiconductor Field Effect Transistors (trench MOSFETs) have been used for various applications including but not limited to switches in power supplies and power converters, e.g., half-bridges.

A key figure for trench MOSFETs which is to be optimized with regard to switching losses and switching speed is the active area-independent product called the Figure of Merit (FOM) which equals the product of the on-state resistance $R_{(DS)ON}$ and the gate charge $Q_G$ to turn on the transistor. The gate charge $Q_G$ depends on the gate-drain capacitance $C_{GD}$.

In view of meeting the demands on electrical characteristics of trench MOSFETs, it is desirable to reduce both their on-state resistance $R_{(DS)ON}$ and their gate-drain capacitance $C_{GD}$, i.e., to reduce the FOM.

SUMMARY

According to one embodiment of a semiconductor device, the semiconductor device includes a semiconductor body including a first surface and a second surface. The semiconductor device further includes a trench structure extending into the semiconductor body from the first surface. The trench structure includes a first gate electrode part and a first gate dielectric part in a first part of the trench structure, and a second gate electrode part and a second gate dielectric part in a second part of the trench structure. A width of the trench structure in the first part is equal to the width of the trench structure in the second part. The semiconductor device further includes a body region adjoining the first and second gate dielectric parts at a side wall of the trench structure. A distance $d_1$ between a bottom edge of the first gate dielectric part and the first surface and a distance $d_2$ between the bottom edge of the second gate dielectric part and the first surface satisfies 50 nm$<d_1-d_2$.

According to another embodiment of a semiconductor device, the semiconductor device includes a semiconductor body including a first surface and a second surface. The semiconductor device further includes a trench structure extending into the semiconductor body from the first surface. The trench structure includes a first gate electrode part in a first part of the trench structure and a second gate electrode part in a second part of the trench structure. A width of the trench structure in the first part is equal to the width of the trench structure in the second part. The semiconductor device further includes a body region adjoining a gate dielectric parts at a side wall of the trench structure. A distance $d_1'$ between a bottom edge of the first gate electrode part and the first surface is larger than a distance $d_2'$ between a bottom edge of the second gate electrode part and the first surface. A distance $d_3$ between the first surface and a bottom edge of the body at a lateral distance from the gate dielectric between 10 nm to 20 nm satisfies −100 nm$<d_1'-d_3<$200 nm.

According to yet another embodiment of a semiconductor device, the semiconductor device includes a semiconductor body including a first surface and a second surface. The semiconductor device further includes a trench extending into the semiconductor body from the first surface. The trench includes a first gate electrode part in a first part of the trench and a second gate electrode part in a second part of the trench. The first gate electrode part and the second gate electrode part are parts of one continuous gate electrode in the trench. The first gate electrode part extends deeper into the semiconductor body from the first surface than the second gate electrode part.

According to an embodiment of a method of forming a semiconductor device, the method includes forming a trench structure extending into a semiconductor body from a first surface. The method further includes forming a first gate dielectric part and a first gate electrode part in a first part of the trench structure, and a second gate dielectric part and a second gate electrode part in a second part of the trench structure. A width of the trench structure in the first part is formed equal to the width of the trench structure in the second part. The method further includes forming a body region adjoining the first and second gate dielectric parts at a side wall of the trench structure. The method further includes forming a distance $d_1$ between a bottom edge of the first gate electrode part and the first surface and a distance $d_2$ between a bottom edge of the second gate electrode part and the first surface which satisfies 50 nm$<d_1-d_2$.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 1 is a schematic illustration of a vertical cross section through a part of a semiconductor body of a trench MOSFET including a first trench with a first gate electrode part and a second trench with a second gate electrode part, wherein the first gate electrode part extends deeper into the semiconductor body than the second gate electrode part.

FIG. 2A is a schematic illustration of a top view of a part of a semiconductor body of a trench MOSFET including a trench, wherein an intersection line AA' intersects a first gate electrode part in a first part of the trench and an intersection line BB' intersects a second gate electrode part in a second part of the trench.

FIG. 2B is a schematic illustration of a vertical cross section through the second part of the trench MOSFET along the line BB' of FIG. 2A.

FIGS. 3A through 3D illustrate schematic cross sections through a part of a semiconductor body during one embodiment of manufacturing a trench MOSFET including gate electrode parts that differ with regard to their vertical extension into the semiconductor body.

FIGS. 4 through 6C are schematic cross sections through a part of a semiconductor body illustrating alternative processes of manufacturing gate electrode parts that differ with regard to their vertical extension into the semiconductor body.

FIG. 7 is a schematic illustration of a plan view along a first surface of a trench MOSFET including a trench, wherein the first gate electrode part and the second gate electrode part are parts of one continuous gate electrode in the trench.

DETAILED DESCRIPTION

Figure 2C:
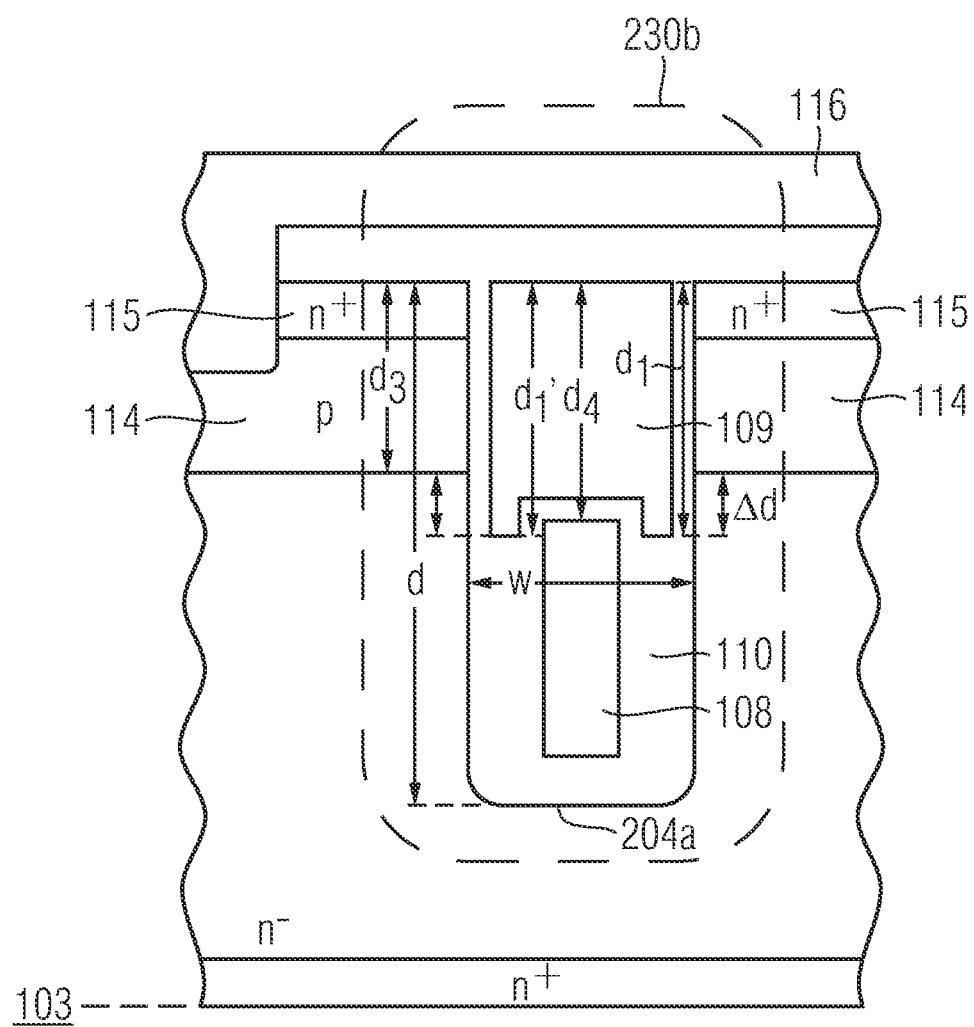
FIG. 2C is a schematic illustration of a vertical cross section through the first part of the trench MOSFET along the line AA' of FIG. 2A, wherein the first gate electrode part extends deeper into the semiconductor body than the second gate electrode part.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an $n^+$ and a $p^+$ region.

Specific embodiments described in this specification pertain to, without being limited thereto, power semiconductor devices which are controlled by field-effect and particularly to unipolar devices such as MOSFETs.

The term "field-effect" as used in this specification intends to describe the electric field mediated formation of an "inversion channel" and/or control of conductivity and/or shape of the inversion channel in a semiconductor channel region.

In the context of the present specification, the term "field-effect structure" intends to describe a structure which is formed in a semiconductor substrate or semiconductor body or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxi-nitride ($SiO_xN_y$), zirconium oxide ($ZrO_2$), tantalum oxide ($Ta_2O_5$), titanium oxide ($TiO_2$) and hafnium oxide ($HfO_2$) or stacks of these materials.

Above a threshold voltage $V_{th}$ between the gate electrode and the source electrode connected typically to the body region, an inversion channel is formed and/or controlled due to the field-effect in a channel region of the body region adjoining the dielectric region or dielectric layer. The threshold voltage $V_{th}$ typically refers to the minimum gate voltage necessary for the onset of a unipolar current flow between the two semiconductor regions of the first conductivity type, which form the source and the drain of a transistor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1 illustrates a trench MOSFET 100 according to an embodiment. The trench MOSFET 100 includes an n−-type semiconductor body 101 with a first surface 102, e.g., a front surface, and a second surface 103, e.g., a rear surface opposite the front surface. A first trench 104 and a second trench 105 extend into the n−-type semiconductor body 101 from the first surface 102. The first and second trenches 104, 105 share a common depth d and a common width w. The first and second trenches 104, 105 may be manufactured, for example, by applying a patterned etching mask at the first surface 102 and etching the n−-type semiconductor body 101 in those parts, which are exposed by the etching mask. The etching process may be an anisotropic etching process predominantly removing the semiconductor material of the n−-type semiconductor body 101 along a vertical direction 106 of the n⁻-type semiconductor body 101 starting from the first surface 102.

In a bottom part of the first trench 104, a first field electrode part 108 is arranged. In a top part of the first trench 104, a first gate electrode part 109 is arranged. A first insulating structure 110 within the first trench 104 includes a first gate dielectric part 110a and electrically insulates the first gate electrode part 109 from the first field electrode part 108. The first insulating structure 110 also electrically insulates each of the first field electrode part 108 and the first gate electrode part 109 from the surrounding n⁻-type semiconductor body 101.

In a bottom part of the second trench 105, a second field electrode part 111 is arranged. In a top part of the second trench 105, a second gate electrode part 112 is arranged. A second insulating structure 113 within the second trench 105 includes a second gate dielectric part 113a and electrically insulates the second gate electrode part 112 from the second field electrode part 111. The second insulating structure 113 also electrically insulates each of the second field electrode part 111 and the second gate electrode part 112 from the surrounding n⁻-type semiconductor body 101.

A p-type body region 114 adjoins to an upper part of sidewalls of each of the first and second trenches 104, 105 along a lateral direction 107. Likewise, an n⁺-type source region 115 extends from the first surface 102 into the n⁻-type semiconductor body 101 and ends at an interface to the p-type body region 114. The n⁺-type source region 115 and the p-type body region 114 are electrically coupled to a wiring area 116 such as a metal area or metal line by a contact 117 such as a contact plug or a contact line.

An n⁺-type drain region 118 is arranged at the second surface 103. The part of n⁻-type semiconductor body 101 between the p-type body region 114 and the n⁺-type drain region 118 constitutes a drift zone 119.

The arrangement and dimensions of the first field electrode part 108 and the first gate electrode part 109 differ from the arrangement and dimensions of the second field electrode part 111 and the second gate electrode part 112, respectively. Further, the dimensions of the first gate dielectric part 110a along the vertical direction 106 differ from the dimensions of the second gate dielectric part 113a along the vertical direction 106. A distance $d_1'$ between a bottom edge of the first gate electrode part 109 and the first surface 102 is larger than a distance $d_2'$ between a bottom edge of the second gate electrode part 112 and the first surface 102. In other words, the first gate electrode part 109 extends deeper into the n⁻-type semiconductor body 101 along the vertical direction 106 than the second gate electrode part 112. Although a bottom edge of the first field electrode part 108 and a bottom edge of the second field electrode part 111 share a same level along the vertical direction 106, a distance $d_4$ between the first surface 102 and a top edge of the first field electrode part 108 is larger than the distance $d_5$ between the first surface 102 and a top edge of the second field electrode part 111. A distance $d_1$ between a bottom edge of the first gate dielectric part 110a and the first surface 102 is larger than a distance $d_2$ between a bottom edge of the second gate dielectric part 113a and the first surface 102.

A distance $d_3$ between the first surface 102 and a bottom edge of the body region 114 at a lateral distance from the first gate dielectric part 110a between 10 nm and 20 nm satisfies $-100$ nm$<d_1'-d_3=d<200$ nm. A location having a lateral distance from the first gate dielectric part 113a between 10 nm and 20 nm is illustrated by reference symbol P in FIG. 1. At P, segregation effects of dopants constituting the body region 114, which may arise at the first and second gate dielectric parts 110a, 113a, can be neglected.

The distance $d_1$ between the bottom edge of the first gate dielectric part 110a and the first surface 102 and the distance $d_2$ between the bottom edge of the second gate dielectric part 113a and the first surface 112 satisfies 50 nm$<d_1-d_2$. According to one embodiment, a relation 50 nm$<d_1-d_2<200$ nm holds. According to another embodiment, a relation 50 nm$<d_1-d_2<500$ nm holds. According to yet another embodiment, a relation 50 nm$<d_1-d_2<1$ μm holds. The bottom edge of the first and second gate dielectric parts define a transition from the first and second gate dielectric parts 110a, 113a to another part of the first and second insulating structures 110, 113, wherein the other part has a larger dimension along the lateral direction 107 than the first and second gate dielectric parts 110a, 113a. In one embodiment, an increase of thickness more than 20% with regard to the thickness of the first and second gate dielectric parts 110a, 113a is considered to define the transition from the first and second gate dielectric parts 110a, 113a to the other part.

The different vertical dimensions $d_1'$ and $d_2'$ of the first and second gate electrode parts 109, 112 lead to the first and gate electrode parts 109, 112 overlapping the drift zone 119 by a different amount. Likewise, the different vertical dimensions $d_1$ and $d_2$ of the first and second gate dielectric parts 110a, 113a lead to the first and second gate dielectric parts 110a, 113a overlapping the drift zone 119 by a different amount. Because of the smaller vertical dimension $d_2'$ of the second gate electrode part 112, the second gate electrode part 112 overlaps the drift zone 119 by a smaller amount so that the gate-drain capacitance $C_{GD}$ is lower in the second trench 105 compared to the gate-drain capacitance between the first gate electrode part 109 in the first trench 104 and the drift zone 119.

Because of the smaller overlap between the second gate electrode part 112 and the drift zone 119 compared to the overlap between the first gate electrode part 109 and the drift zone 119, the turn-on resistance of the MOSFET 100 is higher in an area of the second gate electrode part 112 compared to the area of the first gate electrode part 109. However, the turn-on resistance does not increase by the same amount as the gate-drain capacitance $C_{GD}$/gate charge $Q_G$ decreases when the overlap between the gate electrode and drift zone is reduced, so that in the trench MOSFET 100 the FOM, which corresponds to the active area-independent product of the on-state resistance $R_{(DS)ON}$ and the gate charge $Q_G$, is smaller than in a MOSFET including only gate electrodes corresponding to the second gate electrode parts 112 of the trench MOSFET 100. Thus, that part of the trench MOSFET 100 that includes the first gate electrode part 109 in the first trench 104 constitutes an on-state resistance $R_{(DS)ON}$-switching optimized cell 130 and the part of the trench MOSFET 100 that includes the second gate electrode part 112 constitutes a gate-drain capacitance $C_{GD}$-switching optimized cell 131.

FIG. 2A is a schematic illustration of a top view of a part of a semiconductor body of a trench MOSFET 200 according to another embodiment. The trench MOSFET 200 includes stripe-shaped trenches 204a and 204b. Within the trench 204a, on-state resistance $R_{(DS)ON}$-switching optimized cells such as cells 230a, 230b and gate-drain capacitance $C_{GD}$-switching optimized cells such as cell 231a are alternately arranged along a lateral direction 237. The lateral direction 237 corresponds to the direction of extension of the stripe-shaped trenches 204a, 204b. A width $w_1$ of the trench 204a in a part of a $R_{(DS)ON}$-switching optimized cell such as the cell 230b corresponds to the width $w_2$ of the gate-drain capacitance $C_{GD}$-switching optimized cell such as the cell 231a, i.e., $w_1=w_2$. Furthermore, a width $w_3$ of the trench 204b, which may also include alternately arranged $R_{(DS)ON}$-switching optimized cells and gate-drain capacitance $C_{GD}$-switching optimized cells, corresponds to the width $w_1$ of the trench 204a, i.e., $w_1=w_2=w_3$.

A lateral distance $l_1$ between neighboring two of the trenches such as trenches 204a, 204b and a pitch p between the first gate electrode parts in one of the trenches 204a, 204b, e.g., in the trench 204a, satisfy $p<2\times l_1$. The relation may hold with respect to a reference level depth of 200 nm to the first surface 102 of FIG. 1.

FIG. 2B is a schematic illustration of a vertical cross section through the gate-drain capacitance $C_{GD}$-switching optimized cell 231a along the line B-B' of the trench MOSFET 200 illustrated in FIG. 2A.

The arrangement of the gate-drain capacitance $C_{GD}$-switching optimized cell 231a including the trench 204a corresponds to the gate-drain capacitance $C_{GD}$-switching optimized cell 131 including the second trench 105 of the trench MOSFET 100 illustrated in FIG. 1.

FIG. 2C is a schematic illustration of a vertical cross section through the on-state resistance $R_{(DS)ON}$-switching optimized cell 230b along the line A-A' of the trench MOSFET 200 illustrated in FIG. 2A.

The arrangement of the $R_{(DS)ON}$-switching optimized cell 230b including the trench 204a corresponds to the on-state resistance $R_{(DS)ON}$-switching optimized cell 130 including the first trench 104 of the trench MOSFET 100 illustrated in FIG. 1.

Figure 2D:
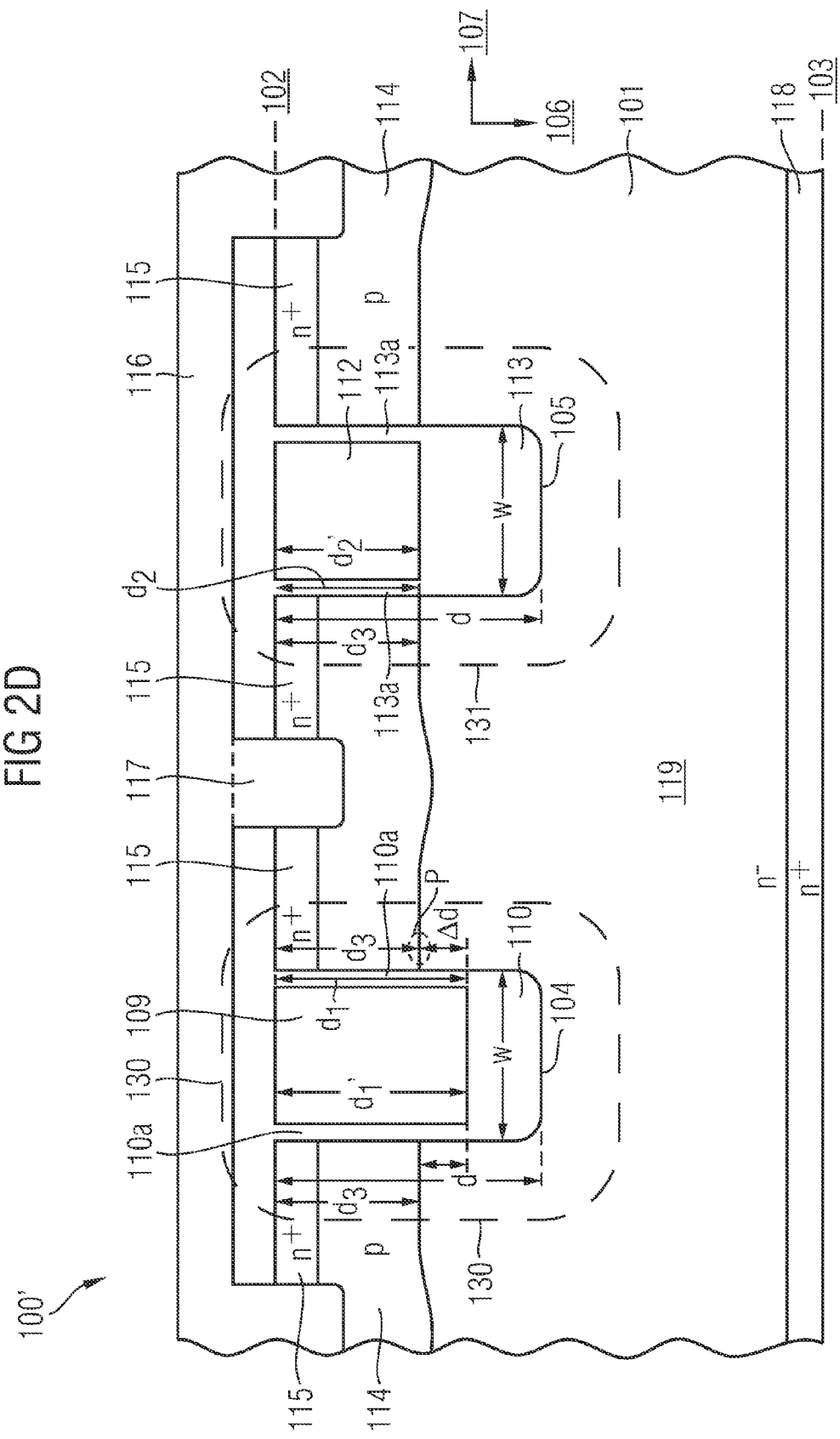
FIG. 2D is a schematic illustration of a vertical cross section through a part of a semiconductor body of a trench MOSFET differing from trench MOSFET 100 by absence of field electrodes below the first and second gate electrode parts.

FIG. 2D is a schematic illustration of a vertical cross section through a part of a semiconductor body of a trench MOSFET 100'. The trench MOSFET 100' differs from the trench MOSFET 100 by absence of field electrodes below the first and second gate electrode parts 109, 112, e.g., by absence of the first and second field electrode parts 108, 111 illustrated in FIG. 1.

In addition to the embodiments illustrated in FIGS. 1 to 2D and according to yet another embodiment, the first gate dielectric part 110a and the second gate dielectric part 113a may be formed directly opposite each other within a same trench. FIG. 7 depicts a plan view along surface 102, wherein the first gate electrode part 109 and the second gate electrode part 112 are parts of one continuous gate electrode in the trench. Thus, the gate-drain capacitance $C_{GD}$-switching optimized cell includes a first subregion of the body region adjoining to one side wall part of the trench and the on-state resistance $R_{(DS)ON}$-switching optimized cell includes another subregion of the body region adjoining to another side wall part of the trench which is directly opposite to the one side wall part. In other words, the one side wall part and the other side wall part face each other along a lateral direction which is perpendicular to a direction of extension of the trench. In this embodiment, a depth of a bottom side of the gate electrode increases along a lateral direction from the first gate dielectric part to the second gate dielectric part.

FIG. 3A illustrates a schematic cross section through a part of a semiconductor body 301 during one embodiment of manufacturing a trench MOSFET. The semiconductor body 301 has been previously processed to include trenches 304a, 304b, 304c extending from a first surface 302 into the semiconductor body 301 along a vertical direction 306. A dielectric structure 340 is arranged on the semiconductor body 301 both in an area of the first surface 302 and on sidewalls as well as on a bottom side of each of the trenches 304a, 304b, 304c. This dielectric structure 340 is, for example, a deposited oxide layer such as a TEOS (tetraethoxysilane) or a thermal oxide layer which is formed by thermal oxidation of the semiconductor body 301 or a nitride. The dielectric structure 340 may also include two dielectric layers 341 and 342 as illustrated in FIG. 3A. The dielectric layer 341 which adjoins the semiconductor body 301 is a thermal oxide layer. The dielectric layer 342 is a deposited oxide layer such as a TEOS layer. The dielectric structure 340 may also include more than two dielectric layers.

A field electrode material 343, which is conductive and includes conductive materials such as doped semiconductors, e.g., doped polysilicon, fills up the trenches 304a, 304b, 304c and covers a top surface of the dielectric structure 340 on the first surface 302.

Referring to the cross sectional view of the semiconductor body 301 of FIG. 3B, an etch mask 344a including an opening above the trench 304b is arranged on the field electrode material 343. The etch mask 344a may be a photoresist patterned by lithography or a patterned hard mask. The field electrode material 343 is partially removed by etching through the opening of the etch mask 344a. This leads to a recess of the field electrode material 343 in an area of the opening of the etch mask 344a.

Following the process state of FIG. 3B and referring to the cross section of the semiconductor body 301 of FIG. 3C, the etch mask 344a is removed and the field electrode material 343 is etched back until the field electrode material 343 partly fills each of the trenches 304a, 304b, 304c. Since the field electrode material 343 has only been recessed above the trench 304b but not above the trenches 304a and 304c, a vertical level 345a of the remaining field electrode material 343 in the trench 304a equals a vertical level 345c of the remaining field electrode material 343 in the trench 304c. However, both the vertical level 345a and the vertical level 345c are located above a vertical level 345b of the remaining field electrode material 343 in the trench 304b. In other words, a distance between the first surface 302 and a top side of the remaining field electrode material 343 in the trench 304b is larger than the corresponding distance of the remaining field electrode material 343 in each of the trenches 304a, 304c.

Following the process state of FIG. 3C and referring to the cross section of the semiconductor body 301 illustrated in FIG. 3D, the dielectric structure 340 is removed in the trenches 304a, 304b, 304c from the sidewalls above and slightly below the levels 345a, 345b, 345c. As an example, the dielectric structure may be partly removed by an isotropic etching process. The dielectric structure 340 is removed in such a manner that the dielectric structure 340 is cut back in the vertical direction 306 belong a top edge of the field electrode material 343 remaining in each of the trenches 304a, 304b, 304c as a consequence of the isotropic etching process. This etching process is followed by the thermal oxidation, by deposition of a thin dielectric layer such as an oxide layer or e.g., a high k dielectric or by wet oxidation. In this process, a dielectric layer 347 such as an oxide layer is formed on the first surface 302 of the semiconductor body 301, on the side walls of the trenches 304a, 304b, 304c and on an exposed top side of the field electrode material 343 in each of the trenches 304a, 304b, 304c. The field electrode material 343 remaining in a lower part of the trenches 304a, 304b, 304c, constitutes field electrode parts 311a, 308, 311b. In addition, a dielectric plug such as an oxide plug may be formed (not illustrated in FIG. 3D), e.g., before formation of a gate dielectric. Then, the trenches 304a, 304b, 304c are filled with a gate electrode material constituting gate electrode parts 312a, 309, 312b.

In view of the local etchback process of field electrode material 343 due to the patterned etch mask 344a in FIG. 3B, a bottom side of the gate electrode part 309 in the trench 304b has a larger extension along the vertical direction 306 into the semiconductor body 301 than the gate electrode parts 312a, 312b in the trenches 304a, 304c. Thus, the gate electrode part 309 in the trench 304b constitutes a part of an on-state resistance $R_{(DS)ON}$-switching optimized cell to be formed and the gate electrode parts 312a, 312b in the trenches 304a, 304c constitute part of gate-drain capacitance $C_{GD}$-switching optimized cells to be formed.

Further process steps such as formation of body, source, drain and interconnections will follow to finalize the trench MOSFET (not illustrated).

Referring to the schematic cross section through the semiconductor body 301 of FIG. 4, an alternative to the local etchback of the field electrode material 343 illustrated in FIG. 3B will be described.

Figure 3D:
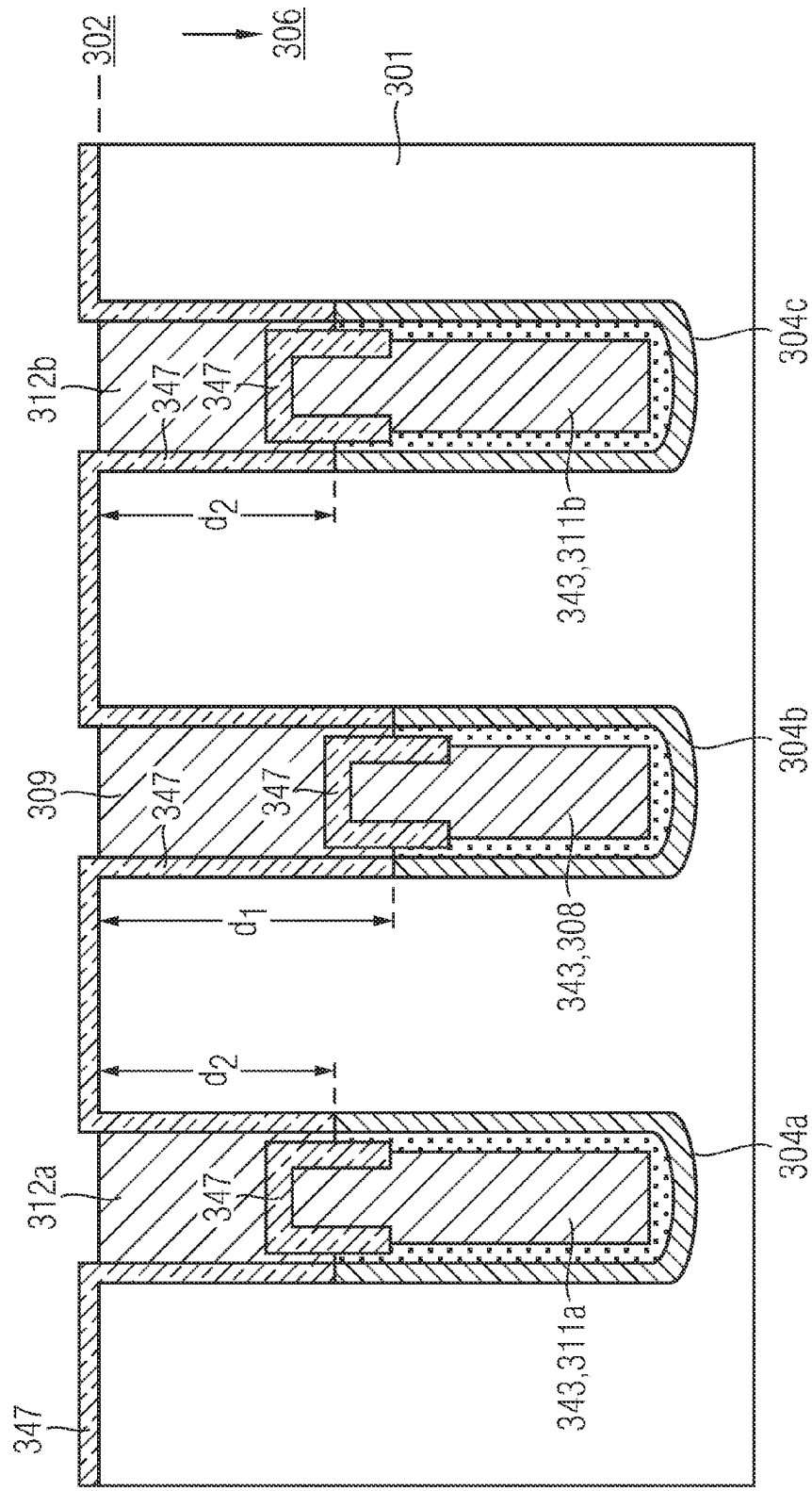

Whereas the field electrode material 343 in FIG. 3B covers a top side of the dielectric structure 340 before the field electrode material 343 is locally etched back via the etch mask 344a, the field electrode material 343 in FIG. 4 is first removed up to a level at a top side of the dielectric structure 340. In this state, the remaining field electrode material 343 fills up each one of the trenches 304a, 304b, 304c to this level. Then, an etch mask 344b including an opening above the trench 304b is formed on a top side of the dielectric structure 340 by lithography. An etch process such as an anisotropic etch process follows to recess the field electrode material 343 in the trench 304b. Thus, a level of a top edge of the field electrode material 343 in the trench 304b is below the top level of the field electrode material 343 in each of the trenches 304a, 304c. Then, the etch mask 344b is removed and the field electrode material 343 is etched back up to the levels 345a, 345b, 345c as is illustrated in FIG. 3C. Further process steps correspond to the ones described with regard to the embodiment illustrated in FIGS. 3A to 3D.

Figure 5:
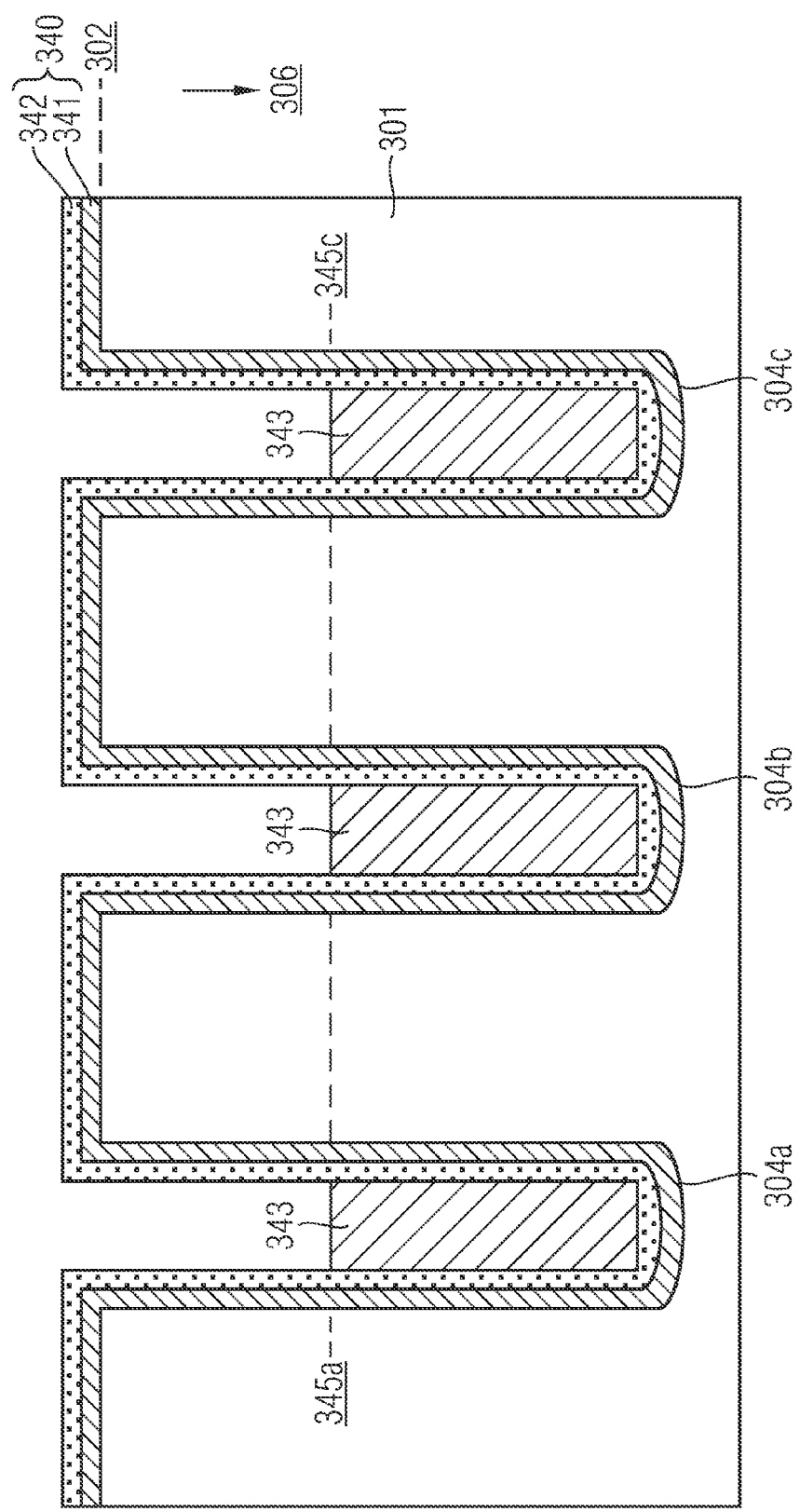

As an alternative to the local etchback of the field electrode material 343 illustrated in the embodiments of FIG. 3B and FIG. 4, the field electrode material 343 illustrated in FIG. 3A may be etched back to a same level in each of the trenches 304a, 304b, 304c as is illustrated in the schematic cross section through the semiconductor body 301 of FIG. 5. Then an etch mask is formed covering a top side of the dielectric structure 340 and of the trenches 304a, 304c, whereas an opening in the etch mask leaves a top side of the trench 304b uncovered (not illustrated). Then the field electrode material 343 in the trench 304b is slightly etched back leading to the process state of FIG. 3C. Then, further processes follow as described with regard to the embodiment illustrated in FIGS. 3A to 3D.

Figure 6A:
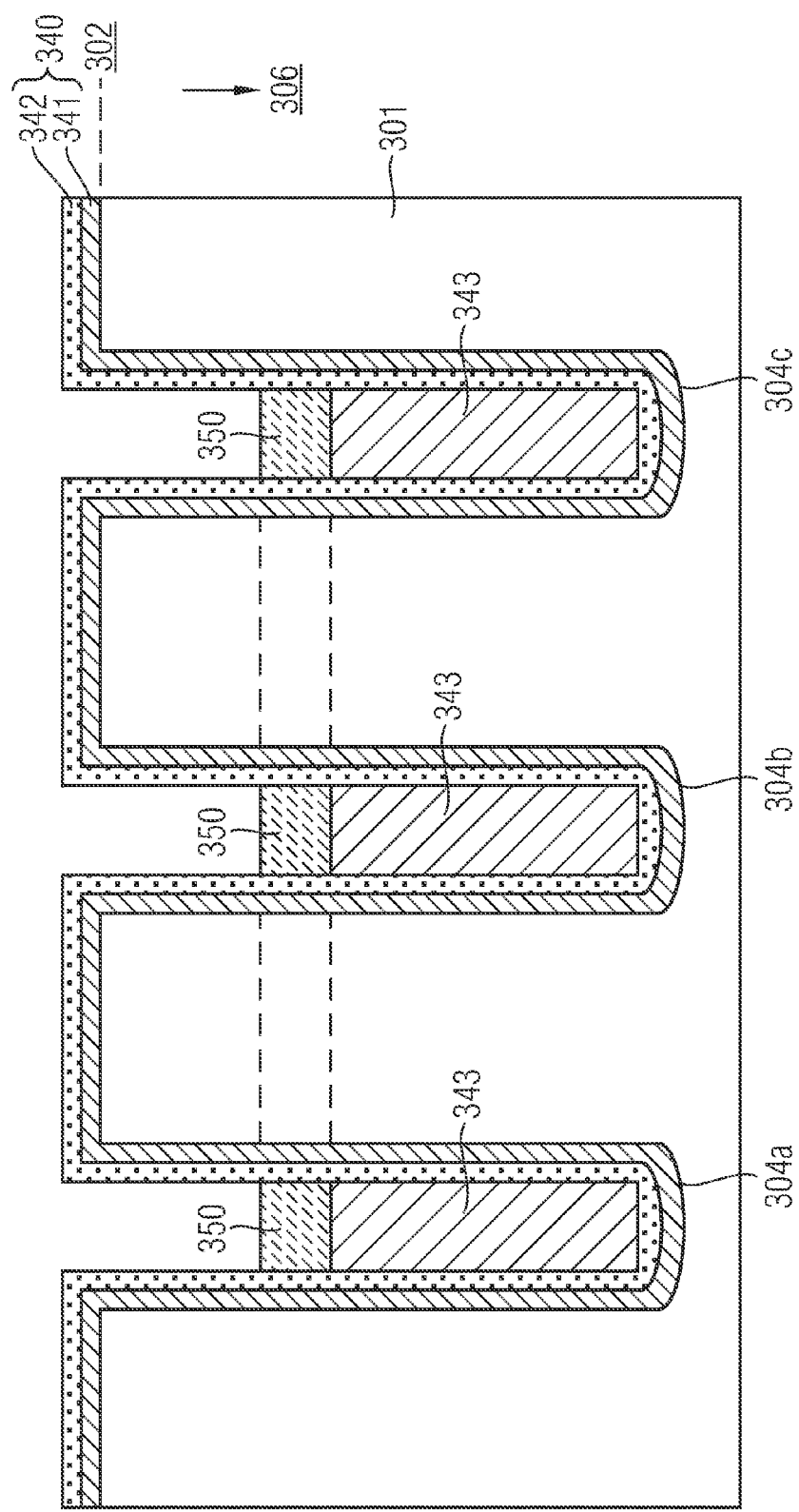
Figure 6C:
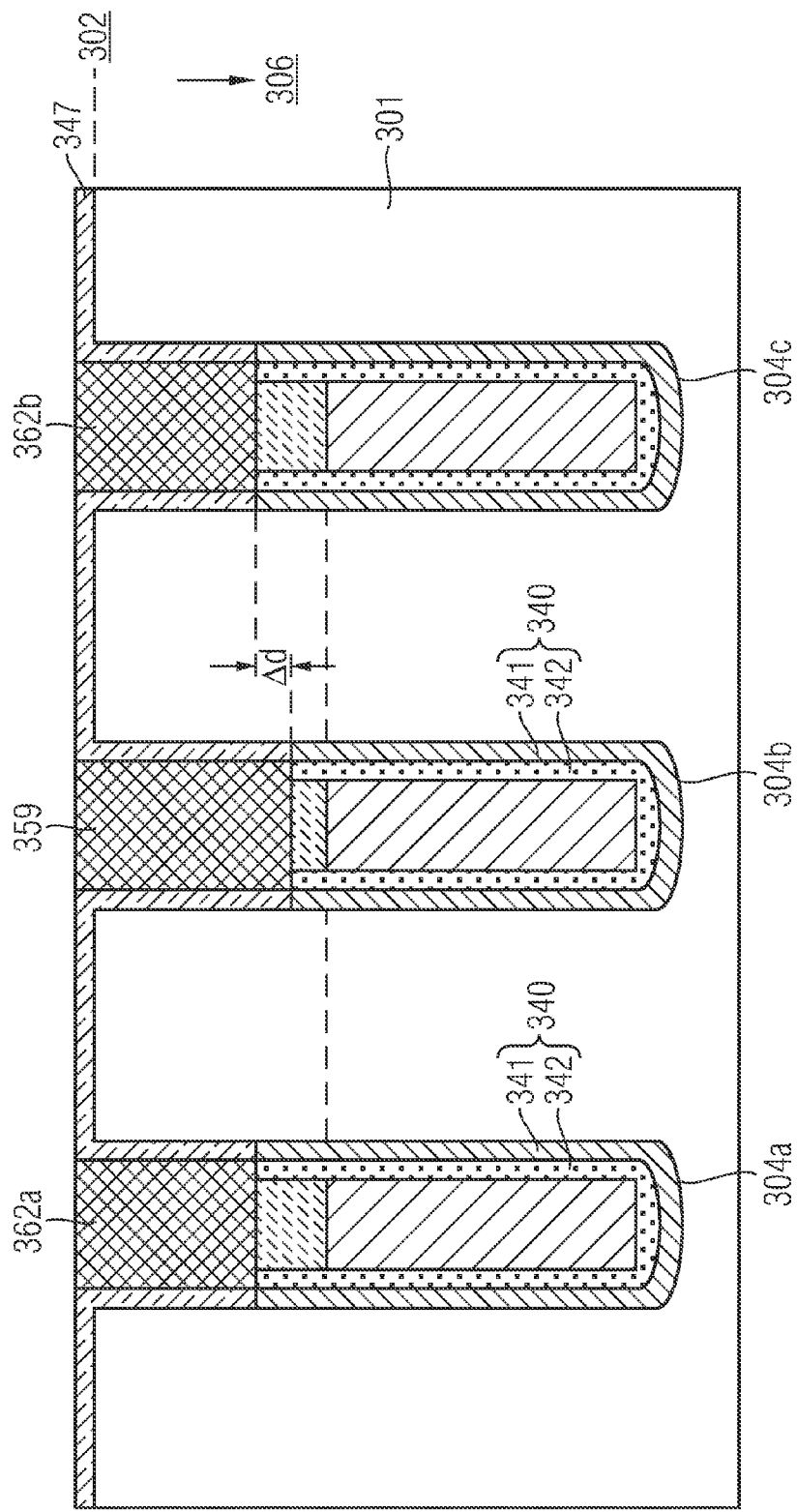

As a further alternative for manufacturing a trench MOSFET including on-state resistance $R_{(DS)ON}$-switching optimized cells and gate-drain capacitance $C_{GD}$-switching optimized cells, reference is made to the schematic cross sections of FIGS. 6A to 6C which follow the process state of FIG. 5. Referring to the schematic cross section through the semiconductor body 301 illustrated in FIG. 6A, a dielectric cap 350, e.g., an oxide cap such as a HDP (high density plasma) oxide cap is formed on a top side of the field electrode material 343 remaining in each of the trenches 304a, 304b, 304c.

Then an etch mask is formed which covers a top side of the dielectric structure 340 and of the trenches 304a, 304c. An opening in the etch mask leaves a top side of the trench 304b open (not illustrated in FIG. 6A).

Referring to the schematic cross section through the semiconductor body 301 of FIG. 6B, the dielectric cap 350 is etched back in the trench 304b by an amount d along the vertical direction 306.

Referring to the schematic cross section through the semiconductor body 301 illustrated in FIG. 6C, the dielectric structure 340 is removed in the trenches 304a, 304b, 304c from sidewalls above the dielectric cap 350 and from the first surface 302 of the semiconductor body 301. Then, a dielectric layer 347 is formed on the sidewalls of the trenches 304a, 304b, 304c above the dielectric cap 350 and on the first surface 302. Then, gate electrode parts 362a, 359, 362b are formed in the trenches 304a, 304b, 304c. Partial removal of the dielectric structure 340 in the trenches 304a, 304b, 304c may also be carried out before formation of the dielectric cap 350 illustrated in FIG. 6A. Likewise, formation of the dielectric layer 347 in the trenches 304a, 304b, 304c may also be carried out before formation of the dielectric cap 350 illustrated in FIG. 6A.

In view of the local etchback of the dielectric cap 350 in the trench 304b, the gate electrode part 359 in the trench 304b extends deeper into the semiconductor body 301 along the vertical direction 306 than the gate electrode parts 362a, 362b in the trenches 304a, 304c. Thus, the gate electrode part 359 in the trench 304b is a part of an on-state resistance $R_{(DS)ON}$-switching optimized cell to be formed and the gate electrode parts 362a, 362b in the trenches 304a, 304c constitute part of gate-drain capacitance $C_{GD}$-switching optimized cells to be formed.

It is to be understood that the features of the various embodiments described herein may be combined with each other, unless specifically noted otherwise.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor body including a first surface and a second surface;
    a trench structure extending into the semiconductor body from the first surface, the trench structure including a first gate electrode part and a first gate dielectric part in a first part of the trench structure, and a second gate electrode part and a second gate dielectric part in a second part of the trench structure, wherein a width of the trench structure in the first part is equal to the width of the trench structure in the second part;
    a body region adjoining the first and second gate dielectric parts at a side wall of the trench structure; and
    wherein a distance d1 between a bottom edge of the first gate dielectric part and the first surface and a distance d2 between a bottom edge of the second gate dielectric part and the first surface satisfies 50 nm<d1−d2.

2. The semiconductor device of claim 1, further comprising a source region adjoining the first and second gate dielectric parts.

3. The semiconductor device of claim 1, further comprising at least one field electrode arranged below the bottom edge of the first gate electrode portion.

4. The semiconductor device of claim 3, comprising a first field electrode part arranged below the first gate electrode part in the first part of the trench structure and a second field electrode part arranged below the second gate electrode part in the second part of the trench structure, and wherein a distance between a top edge of the first field electrode part and the first surface is larger than the distance between a top edge of the second field electrode part and the first surface.

5. The semiconductor device of claim 1, wherein the first gate electrode part and the second gate electrode part are parts of one continuous gate electrode in a trench.

6. The semiconductor device of claim 5, comprising a plurality of the first gate electrode parts and a plurality of the second gate electrode parts, wherein the plurality of the first gate electrode parts and the plurality of the second gate electrode parts are alternately arranged within the trench.

7. The semiconductor device of claim 6, comprising a plurality of the trenches, each trench including the plurality of the first gate electrode parts and the plurality of the second gate electrode parts alternately arranged, wherein a lateral distance l1 between neighboring ones of the trenches and a pitch p between the first gate electrode parts in one of the trenches fulfill the relationship p<2×l1 with respect to a reference level depth of 200 nm to the first surface.

8. The semiconductor device of claim 5, further comprising:
a first field electrode part arranged below the first gate electrode part in the first part of the trench structure;
a second field electrode part arranged below the second gate electrode part in the second part of the trench structure; and
wherein a distance between a top edge of the first field electrode part and the first surface equals the distance between a top edge of the second field electrode part and the first surface.

9. The semiconductor device of claim 1, wherein the first part of the trench structure comprises a first trench and the second part of the trench structure comprises a second trench.

10. The semiconductor device of claim 9, wherein the first trench and the second trench are shaped as stripes and extend in parallel to each other.

11. The semiconductor device of claim 9, wherein the body region is laterally confined by the first trench on one side and the second trench on the other side.

12. The semiconductor device of claim 1, wherein the first gate electrode part is electrically connected to the second gate electrode part.

13. The semiconductor device of claim 1, wherein the semiconductor device is a field-effect structure.

14. The semiconductor device of claim 13, wherein the field-effect structure is a field effect transistor.

15. A semiconductor device, comprising:
a semiconductor body including a first surface and a second surface;
a trench structure extending into the semiconductor body from the first surface, the trench structure including a first gate electrode part in a first part of the trench structure and a second gate electrode part in a second part of the trench structure, wherein a width of the trench structure in the first part is equal to the width of the trench structure in the second part;
a body region adjoining a gate dielectric at a side wall of the trench structure;
wherein a distance d1' between a bottom edge of the first gate electrode part and the first surface is larger than a distance d2' between a bottom edge of the second gate electrode part and the first surface; and
wherein a distance d3 between the first surface and a bottom edge of the body at a lateral distance from the gate dielectric between 10 nm to 20 nm satisfies −100 nm<d1'−d3<200 nm.

16. The semiconductor device of claim 15, wherein the first gate electrode part and the second gate electrode part are parts of one continuous gate electrode in a trench.

17. The semiconductor device of claim 15, wherein the first part of the trench structure comprises a first trench and the second part of the trench structure comprises a second trench.

18. The semiconductor device of claim 15, further comprising:
a first field electrode part arranged below the first gate electrode part in the first part of the trench structure;
a second field electrode part arranged below the second gate electrode part in the second part of the trench structure; and
wherein a distance between a top edge of the first field electrode part and the first surface equals the distance between a top edge of the second field electrode part and the first surface.

19. A semiconductor device, comprising:
a semiconductor body including a first surface and a second surface;
a trench extending into the semiconductor body from the first surface, the trench including a first gate electrode part in a first part of the trench and a second gate electrode part in a second part of the trench, the first gate electrode part and the second gate electrode part being parts of one continuous gate electrode in the trench; and
wherein the first gate electrode part extends deeper into the semiconductor body from the first surface than the second gate electrode part.

20. The semiconductor device of claim 19, comprising a plurality of the first gate electrode parts and a plurality of the second gate electrode parts, wherein the plurality of the first gate electrode parts and the plurality of the second gate electrode parts are alternately arranged in the trench.

21. The semiconductor device of claim 19, further comprising:
a first field electrode part arranged below the first gate electrode part in the first part of the trench; and
a second field electrode part arranged below the second gate electrode part in the second part of the trench; and
wherein a distance between a top edge of the first field electrode portion and the first surface is larger than the distance between a top edge of the second field electrode portion and the first surface.

* * * * *